(12) United States Patent
Sahu et al.

(10) Patent No.: US 7,719,365 B2
(45) Date of Patent: May 18, 2010

(54) METHOD AND APPARATUS FOR REDUCING SILICON AREA OF A PHASE LOCK LOOP (PLL) FILTER WITHOUT A NOISE PENALTY

(75) Inventors: Debapriya Sahu, Bangalore (IN); Saravana Ganeshan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 11/900,703

(22) Filed: Sep. 12, 2007

(65) Prior Publication Data
US 2009/0066446 A1    Mar. 12, 2009

(51) Int. Cl.
*H03L 7/00*    (2006.01)
(52) U.S. Cl. ............................ 331/17; 327/336; 327/344
(58) Field of Classification Search ................. 327/336, 327/344, 551–559, 156; 331/15, 17; 333/172
See application file for complete search history.

(56) References Cited
U.S. PATENT DOCUMENTS

| | | | | |
|---|---|---|---|---|
| 4,514,706 A | * | 4/1985 | Thompson | .................... 331/16 |
| 5,175,510 A | * | 12/1992 | Satomaki | ...................... 331/17 |
| 5,874,862 A | * | 2/1999 | Clarke et al. | ................... 331/17 |
| 6,304,128 B1 | * | 10/2001 | Shulman | ...................... 327/345 |
| 2004/0140843 A1 | * | 7/2004 | Rodby | .......................... 327/336 |
| 2004/0155702 A1 | * | 8/2004 | Danielsson | ................. 327/552 |

* cited by examiner

*Primary Examiner*—Joseph Chang
*Assistant Examiner*—Jeffrey Shin
(74) *Attorney, Agent, or Firm*—Ronald O. Neerings; Wade James Brady, III; Frederick J. Telecky, Jr.

(57) ABSTRACT

In a method and system for filtering an input signal with a filter included in a phase locked loop (PLL), a unidirectional feedback path is configured from an output of the filter to an input of the filter. The unidirectional feedback path includes a feedback resistor that is configured to adjust a bandwidth of the PLL. A zero path is configured from the output to a voltage reference, such as ground. The zero path includes a capacitor coupled in series with a bias resistor. The bias resistor, which along with the capacitor determines a zero frequency of the filter, is configured to reduce a value of the capacitor without a substantial increase in a phase noise of the PLL due to the unidirectional nature of the feedback. A reduction in the value of the capacitor enables a corresponding reduction in a silicon area to form the capacitor.

23 Claims, 10 Drawing Sheets

METHOD AND APPARATUS FOR REDUCING SILICON AREA OF A PHASE LOCK LOOP (PLL) FILTER WITHOUT A NOISE PENALTY

BACKGROUND

The present invention is related in general to the field of electronic circuits, and more specifically to an apparatus and method for reducing silicon area of a loop filter included in a phase locked loop (PLL) without increasing noise.

A PLL is a well-known electronic circuit used in many semiconductor devices. A PLL is a closed loop feedback control circuit which provides an output signal that is locked in phase and frequency of an input signal used as a reference. FIG. 1A is a simplified block diagram of a type II phase locked loop 100, according to prior art. The PLL 100 includes a phase frequency detector (PFD) 110, a charge pump (CP) 120, a loop filter 130, a voltage-controlled oscillator (VCO) 140, and an optional divider 150. The PFD 110 compares a feedback signal 112 received from the divider 150 with a reference signal 102 and generates an error signal 104 which is proportional to the magnitude of the phase/frequency difference between them. The error signal 104 is provided to the CP 120. The CP 120 provides a current output to control a magnitude of the charge stored in the loop filter 130, thus converting the output of the PFD 110 to a control voltage input 106 recognizable by the VCO 140. The VCO 140 generates an output frequency signal 108 proportional to the control voltage input 106. The output frequency signal 108 may be optionally further divided down by the divider 150 before being fed back to the PFD 110. When the PLL 100 is "locked", there is a constant phase difference (usually zero) between the feedback signal 112 and a reference signal 102 and their frequencies are matched.

It is well known that the loop filter 130 may be implemented using passive components such as a passive resistor capacitor (RC) circuit or may be implemented using an active component such as an operational amplifier (OA or opamp) used in combination with an RC circuit. A large value of a capacitor may be required to provide a lower zero frequency of the loop filter 130. In addition, the large value of the capacitor may also be used to help reduce the value of the resistor and hence the phase noise. However, a capacitor having a large value consumes a significant portion of silicon chip area. In some conventional filters, the capacitor having the large value may be fabricated off-chip, e.g., as an externally mounted device.

FIG. 1B illustrates a traditional loop filter 160 having an input 162 and an output 164, according to prior art. The loop filter 130 described with reference to FIG. 1A may be implemented as the traditional loop filter 160. The traditional loop filter 160 is implemented with an OA 166 and a RC circuit. The RC circuit includes a resistor R 152 coupled in series with a capacitor 154, the resistor R 152 being coupled to the input 162 and the capacitor 154 being coupled to the output 164. A capacitor C 156 is connected between the output 164 and the input 162 to filter high frequencies. Active filters such as the traditional loop filter 160 may be used in processes having high device leakage or in cases where voltage at the CP 120 output needs to be substantially constant.

FIG. 1C illustrates a prior art loop filter 170 having multiple active components, according to prior art. The loop filter 130 described with reference to FIG. 1A may be implemented as the prior art loop filter 170. The loop filter 170 is substantially similar to the traditional loop filter 160 except for an additional transconductance amplifier 172. The loop filter 170 includes the resistor 152 coupled in series with the capacitor 154, the resistor R 152 being coupled to the output 164 and the capacitor 154 being coupled to the input 162. Inputs of the transconductance amplifier 172 are coupled across the resistor R 152 and the output of the transconductance amplifier 172 is coupled to the input 162. The loop filter 170 increases a value of the resistor R 152, thereby reducing a value of the capacitor C 154, by adjusting the transconductance amplifier 172. However, traditional and prior art loop filters such as the loop filters 160 and 170 which use active components are susceptible to phase noise generated by the resistor R 152, especially phase noise generated within a bandwidth of the filter. The phase noise is typically dependent on a selected value of the resistor R 152, which affects the value of the capacitor C 154. Thus, traditional and prior art loop filters are often not able to control introduction of phase noise, while attempting to reduce the value, and hence the size, of the capacitor C 154.

SUMMARY

Applicants recognize an existing need for an apparatus and method for efficiently filtering an input signal, absent the disadvantages found in the prior art techniques discussed above. Applicants also recognize an existing need for the improved apparatus and method for filtering to provide: 1) separate controls for controlling filter bandwidth and phase noise, 2) a larger value of the resistor, thereby enabling a smaller value of a capacitor, but without incurring a phase noise penalty associated with the use of a larger resistor, 3) a narrow bandwidth without increasing a size of the capacitor, 4) not being forced to reduce charge pump gain from a desired value that is optimized for noise to maintain the narrow bandwidth, 5) a controllable direct current (DC) bias across the capacitor to enable a reduced VCO gain and an improved direct current (DC) voltage range for the VCO input, and 6) a suitable DC voltage across the capacitor for proper operation.

The foregoing need is addressed by the teachings of the present disclosure, which relates to a system and method for filtering an input signal. According to one embodiment, in a method and system for filtering an input signal with a filter included in a phase locked loop (PLL), a unidirectional feedback path is configured from an output of the filter to an input of the filter. The unidirectional feedback path includes a feedback resistor that is configured to adjust a bandwidth of the PLL. A zero path is configured from the output to a voltage reference, such as ground. The zero path includes a capacitor coupled in series with a bias resistor. The bias resistor, which along with the capacitor, determines a zero frequency of the filter, is configured to reduce a value of the capacitor without a substantial increase in a phase noise of the PLL due to the unidirectional nature of the feedback. A reduction in the value of the capacitor enables a corresponding reduction in a silicon area to form the capacitor.

In one aspect of the disclosure, a method for filtering includes configuring a unidirectional feedback path from an output to an input of a filter, the filter being included in a PLL. The unidirectional feedback path includes a feedback resistor that is configured to adjust a bandwidth of the filter. A zero path is configured from the output to a voltage reference node. The zero path, which determines a zero frequency of the filter, includes a capacitor coupled in series with a bias resistor, the bias resistor being configured to reduce a value of the capacitor without a substantial increase in a phase noise of the PLL.

Several advantages are achieved by the method and system according to the illustrative embodiments presented herein. The embodiments advantageously provide an improved apparatus and method for filtering an input signal. The improved apparatus and method advantageously provides the benefits of having an active RC circuit with a large resistance and a small capacitance (potentially reducing the silicon area of the capacitance by a factor of 10) without incurring the noise penalty associated with the large resistance. That is, a noise generated by the bias resistor having the larger resistance value n*R is substantially the same as a noise generated by the traditional filter having the resistor equal in value to the feedback resistor Rfb, which has the smaller value. The improved filter advantageously disables a feedforward path from the input to the output of the filter to reduce the phase noise. Unlike the traditional filter, different resistances advantageously determine the pole/zero locations and the bandwidth of the filter, thereby improving independent control over the bandwidth and stability of the improved filter. Proper DC biasing for the capacitance included in the zero path advantageously enables a wide DC tuning range for the VCO, and an optimum performance of the capacitor.

DETAILED DESCRIPTION

Figure 1A:
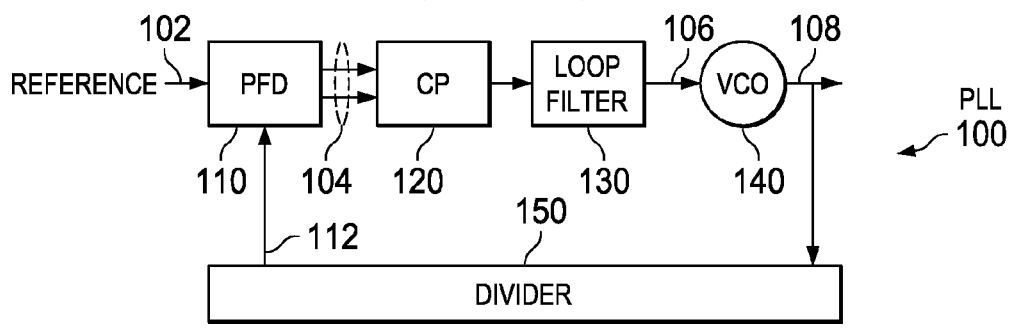
FIG. 1A is a simplified block diagram of a type II phase-locked loop, described herein above, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not be drawn to scale and some features of embodiments shown and described herein may be simplified or exaggerated for illustrating the principles, features, and advantages of the disclosure.

Traditional and prior art loop filters used in a PLL, built using RC circuits with or without active components, have a trade off between the resistance, size of the capacitance, and the phase noise. Limiting phase noise in a loop filter is typically achieved by small resistors at the expense of having larger sized capacitors. Reducing the size of capacitors often results in increasing the resistance, which results in an increased phase noise generated by the resistance. These problems, among others, may be addressed by a system and method for filtering a signal. According to an embodiment, in a method and system for filtering an input signal with a filter included in a phase locked loop (PLL), a unidirectional feedback path is configured from an output of the filter to an input of the filter. The unidirectional feedback path includes a feedback resistor that is configured to adjust a bandwidth of the PLL. A zero path is configured from the output to a voltage reference, such as ground. The zero path includes a capacitor coupled in series with a bias resistor. The bias resistor, which determines a zero frequency of the filter, is configured to reduce a value of the capacitor without a substantial increase in a phase noise of the PLL due to the unidirectional nature of the feedback. A reduction in the value of the capacitor enables a corresponding reduction in a silicon area to form the capacitor. A filter apparatus for efficiently filtering an input signal is described with reference to FIGS. 2A, 2B, 2C, 3A, 3B, 4A, 4B, 4C, 4D, FIG. 5, and FIGS. 6A and 6B.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more ICs packaged into a module.

Phase Noise—Phase noise is a measure of variation in signal timing, but the results are displayed in the frequency domain. In an oscillator circuit, phase noise is described as the random fluctuations in the phase of a signal that may be typically caused by time domain uncertainties. The effect of phase noise causes timing jitter on the zero crossings of the waveform of the signal.

Configuration—Describes a set up of an element, a circuit, a package, an electronic device, and similar other, and refers to a process for setting, defining, or selecting particular properties, parameters, or attributes of the device prior to or during its use or operation. Some configuration attributes may be selected to have a default value. For example, for obtaining a desired filter bandwidth, a resistance value for a feedback resistor may be configured to be equal to 5 kilo ohms.

Figure 2A:
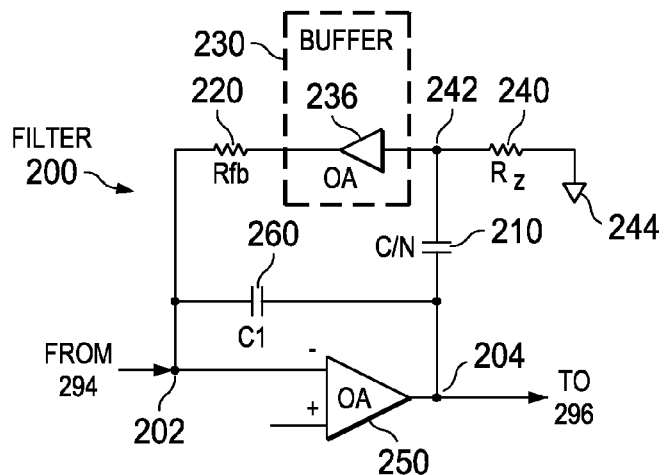
FIG. 2A is a schematic circuit diagram of a filter having a buffer implemented as an operational amplifier, according to an embodiment.
Figure 2B:
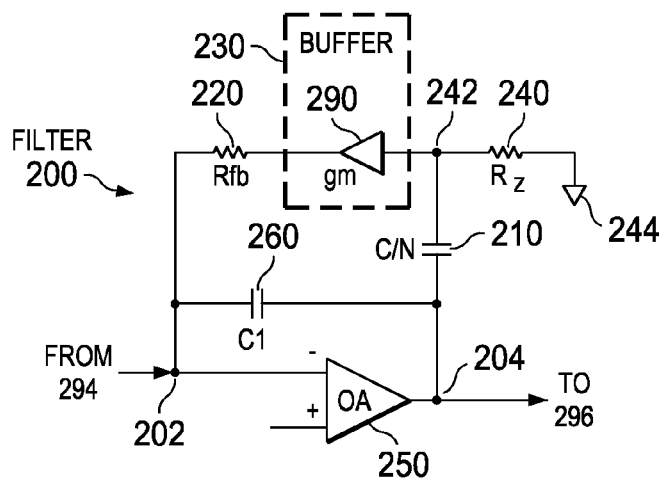
FIG. 2B is a simplified circuit diagram of a filter described with reference to FIG. 2A having a combination of a buffer and a feedback resistor replaced by a transconductance amplifier, according to an embodiment.
Figure 2C:
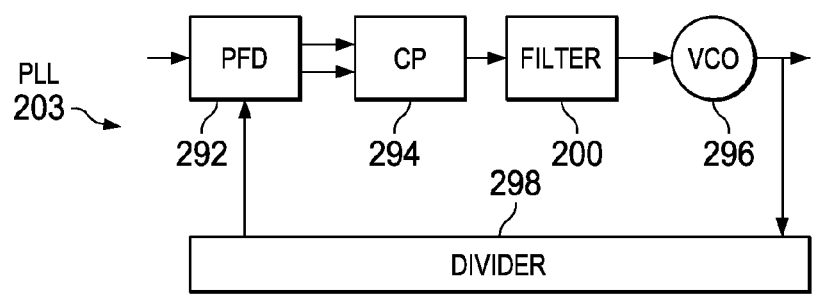
FIG. 2C is a block diagram of a phase locked loop (PLL) having a filter described with reference to FIGS. 2A and 2B, according to an embodiment.

FIG. 2A is a simplified circuit diagram of a filter 200 having a buffer implemented as an operational amplifier 236, according to an embodiment. FIG. 2B is a simplified circuit diagram of the filter 200 described with reference to FIG. 2A having a combination of a buffer and a feedback resistor implemented as a transconductance amplifier gm 290, according to an embodiment. FIG. 2C is a block diagram of a phase locked loop (PLL) 203 having the filter 200 described with reference to FIGS. 2A and 2B, according to an embodiment. In a particular embodiment, the PLL 203 is similar to the PLL 100 except for the filter 200 replacing the loop filter 130. The PLL 203 includes a PFD 292, a charge pump (CP) 294, a VCO 296, and an optional divider 298.

Referring to FIGS. 2A and 2C, the filter 200 is an active RC filter that is operable to selectively pass a range of frequencies of a signal received as input. The filter 200 receives a current signal at an input 202 and provides a voltage signal at an output 204. In a particular embodiment, the current signal is provided by the charge pump 294 and the voltage signal at the output 204 is provided to the voltage controlled oscillator (VCO) 296. The voltage signal provided at the output 204 includes a range of frequencies that are configured by selecting particular values for the RC components of the filter 200. The filter 200 includes a capacitor C/n 210 coupled between the output 204 and a node Vn 242 and a buffer 230 coupled between the node Vn 242 and a first terminal of a feedback resistor Rfb 220, the second terminal of the feedback resistor Rfb being coupled to the input 202. In a particular embodiment, the capacitor C/n 210 is the capacitor C 154 divided by n, where n is a scaling factor. In the depicted embodiment, the buffer 230 is implemented as the operational amplifier (OA) 236 having a unity gain. The buffer 230, which has low output impedance, has a buffer input coupled to the node Vn 242 and a buffer output coupled to the first terminal of the feedback resistor Rfb 220. The buffer 230 advantageously disables a feedforward path from the input 202 to the output 204, thereby reducing noise caused by having the feedforward path and virtually eliminating the effect of the feedback resistor Rfb 220 on the zero frequency of the filter 200.

The filter 200 also includes a bias resistor Rz 240 coupled between the voltage node Vn 242 and an output voltage reference node 244. The output voltage reference node 244 is configurable to provide a direct current (DC) bias to the capacitor C/n 210 including a ground reference. Proper DC biasing for the capacitance C/n 210 advantageously enables a wide DC tuning range for the VCO 296. In a particular embodiment, the bias resistor Rz 240 is configurable to adjust the DC bias. In a particular embodiment, the bias resistor Rz 240 is the resistor R 152 multiplied by n, where n is the scaling factor. Rz 240 working in combination with the capacitor C/n 210 provides the stabilizing zero of the filter 200, which was provided by Rl 52 and C 154 in traditional and prior art filters. As described earlier, the buffer 230 enables a unidirectional (enables signal to flow in one direction only) feedback path for a signal from the output 204 to the input 202. The unidirectional feedback path includes the capacitor C/n 210 and the feedback resistor Rfb 220. Also included in the filter 200 is an operational amplifier OA 250 coupled between the input 202 and the output 204. The OA 250 includes a first input coupled to the input 202 and a second input coupled to an input voltage reference. In a particular embodiment, the OA 250 receives a current signal in a pulse form from the charge pump 294 at the first input and provides a voltage signal at the output 204 that is coupled to the VCO 296. The charge pump 294 generates a current output that is proportional to the detected phase error at its input. In the depicted embodiment, the filter 200 includes a filter capacitor C1 260 coupled between the output 204 and the input 202. The filter capacitor C1 260 reduces a high frequency ripple on the voltage signal at the output 204.

A zero path of the filter 200 includes nodes and components which determine a zero frequency of the filter 200. The zero path includes the output 204, the capacitor C/n 210, the bias resistor Rz 240, and the output voltage reference node 244. Specifically, the zero frequency of the filter 200 is determined by the capacitor C/n 210 and the bias resistor Rz 240 as shown below by equations 100, 110, 120 and 130. Current provided by the buffer 230 and Rfb 220 is computed as voltage at node Vn 242 divided by the feedback resistor Rfb 220. Current at the OA 250 is:

$$icpump = Vn/Rfb + sC1 * Vtune \qquad \text{Equation 100}$$

where icpump is the current received from the charge pump 294 at the input 202, C1 is the filter capacitor C1 260, and Vtune is the voltage at the output 204. Substituting for voltage at node Vn 242 in terms of the output voltage:

$$icpump = (Vtune * Rz/(Rz + 1/(sC/n)))/Rfb + sC1 * Vtune \qquad \text{Equation 110}$$

After rearranging equation 110:

$$Vtune = icpump * (1 + (s*C*Rz/n))/(s((s*C*C1*Rz)/n + C1 + (Rz*C)/(Rfb*n))) \qquad \text{Equation 120}$$

Therefore, the numerator portion of equation 120, e.g., $1+(s*C*Rz/n)$ determines the zero frequency of the transfer function of the filter 200. The feedback resistor Rfb 220 determines a non-dominant pole (denominator of equation 120) and the filter capacitor C1 260 is configured based on the value of the Rfb 220.

A bandwidth of the PLL 203 which includes the filter 200 is determined by the charge pump current (icpump), VCO gain (Kv), the feedback resistor Rfb 220, and a feedback divider factor (M). Specifically:

$$bandwidth = (icpump * Rfb * Kv)/M \text{(approximately)} \qquad \text{Equation 130}$$

Therefore, the zero frequency of the filter 200 is advantageously controllable by adjusting the bias resistor Rz 240 and the bandwidth of the filter 200 is advantageously controllable by adjusting the feedback resistor Rfb 220. That is, the feedback resistor Rfb 220 may be advantageously adjusted to control the loop bandwidth without changing the zero frequency.

FIG. 2B is a simplified circuit diagram of the filter 200 described with reference to FIG. 2A having the buffer 230 and Rfb 220 implemented as a transconductance amplifier gm 290, according to an embodiment. Conductance is the reciprocal of resistance and transconductance is the ratio of the current at the output port and the voltage at the input port(s) and is typically written as gm. In the depicted embodiment, the filter 200 includes the buffer 230 implemented as the transconductance amplifier gm 290 instead of the combination of operational amplifier 236 having a unity gain and the feedback resistor Rfb 220. The transconductance amplifier gm 290 converts the voltage at the node Vn 242 to a feedback current, which is combined with the icpump current received at the input 202 from the charge pump 294.

In a particular embodiment, a bandwidth of the PLL 203 which includes the filter 200 is determined by the charge pump current (icpump), VCO gain (Kv), a value of the transconductance amplifier gm 290, and the feedback divider factor (M). Specifically:

$$\text{bandwidth} = (i\text{cpump} * Kv)/(gm * M) \text{(approximately)} \qquad \text{Equation 140}$$

Therefore, the zero frequency of the filter 200 is advantageously controllable by adjusting the bias resistor Rz 240 and the bandwidth of the filter 200 is advantageously controllable by adjusting the transconductance amplifier gm 290. That is, the transconductance amplifier gm 290 may be advantageously adjusted to control the loop bandwidth without changing the zero frequency. In addition, this helps maintain a desired phase margin and hence maintain a reduced peaking of phase noise at the edge of loop bandwidth.

Figure 1B:
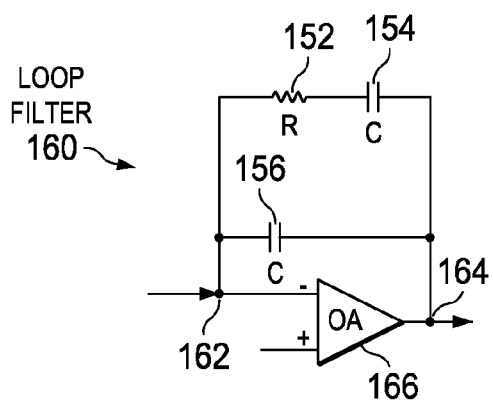
FIG. 1B illustrates a traditional loop filter having an active component, described herein above, according to prior art.
Figure 3A:
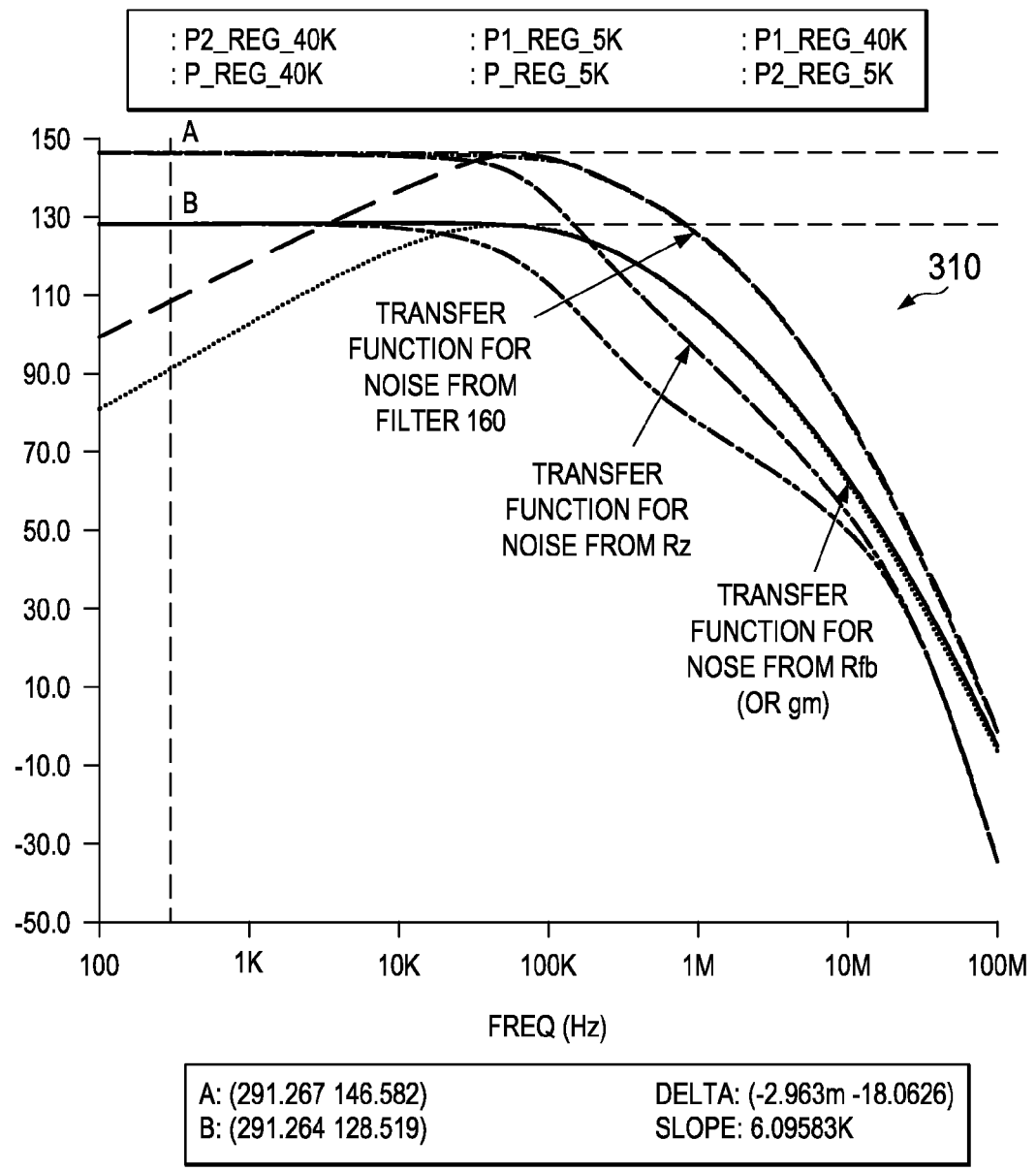
FIG. 3A is a graph illustrating noise for a traditional filter described with reference to FIG. 1B.
Figure 3B:
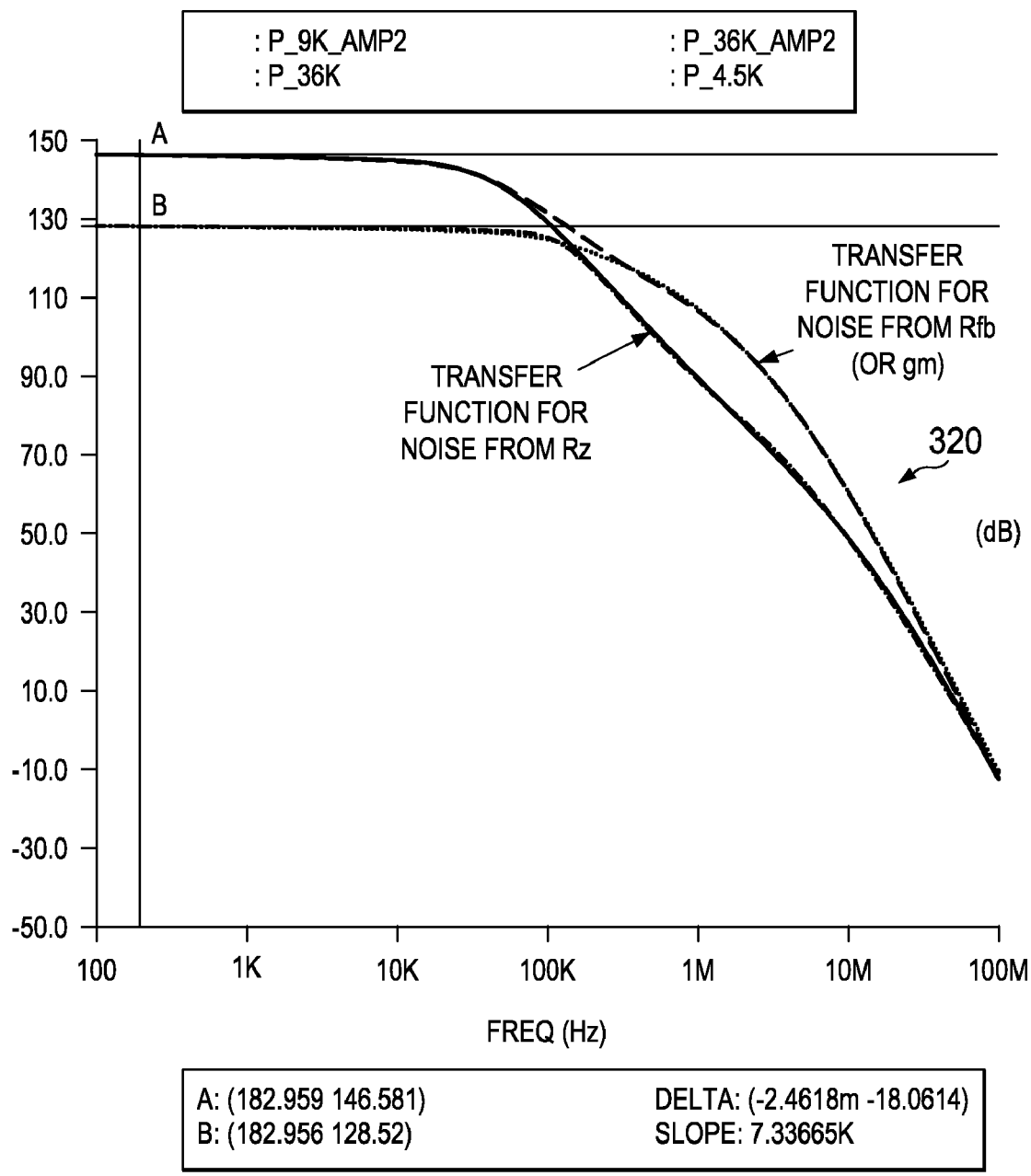
FIG. 3B is a graph illustrating noise for a filter described with reference to FIGS. 2A, 2B, and 2C, according to an embodiment.

FIG. 3A is a graph 310 illustrating noise for a traditional filter described with reference to FIG. 1B. FIG. 3B is a graph 320 illustrating noise for a filter described with reference to FIGS. 2A, 2B, and 2C, according to an embodiment. In a particular embodiment, the graphs 310 and 320 are derived by using modeling or simulation tools. Noise is typically generated by resistors and active elements in an electrical circuit. For modeling purpose, an electrical element such as a resistor is segmented into an ideal portion that is free from noise and a portion generating noise. Noise for the PLL 203 as described with reference to FIG. 2C is generated by the sum of noise generated by three sources including an input phase noise received by the PFD 292, a noise generated by the charge pump 294 and the filter 200, and a noise of the VCO 296. Noise of the filter 200 refers to the integrated phase noise. As described earlier, the phase noise is a measure of variation in signal timing, but the results are displayed in the frequency domain. In a PLL, phase noise is described as the random fluctuations in the phase of a signal that may be typically caused by time domain uncertainties. The effect of phase noise causes timing jitter on the zero crossings of the waveform of the signal.

Referring to FIGS. 2A, 2B, and 2C, the noise generated by the feedback resistor Rfb 220 is derived by adding a noise current source (not shown) between the input 202 and a DC voltage reference node, e.g., ground reference, in the simulation tool. The DC voltage reference node is illustrated as an output voltage reference node 244. Similarly, the noise generated by the bias resistor Rz 240 is derived by adding a noise current source (not shown) between the node Vn 242 and the output voltage reference node 244 in the simulation tool. The simulations are performed with the worst case flicker noise models of 1218C021 process with the actual implemented trans-conductance circuits. In non-simulated, real test circuits, the increase of phase noise at low frequencies may be less than what is indicated by the simulation tool. In processes where flicker noise is better than in C021, the improvement may be greater.

Referring to FIG. 3A, due to the presence of both feedback and feed-forward, the noise (measured in dB on Y axis) of the resistor R 152 has band-pass type characteristics, and this noise is present at the output till very high offset frequencies (measured in hertz on X axis), e.g., above 10 megahertz. The noise increases with larger resistance values of the resistance R 152. Referring to FIG. 3B, the output phase noise from the resistors Rz 240 and Rfb 220 in the filter 200 is low pass in nature since one end of the noise currents is terminated at a DC voltage reference, such as the output voltage reference node 244, or a ground reference. A value of the bias resistor Rz 240 and a value of the feedback resistor Rfb 220 are configurable to attenuate phase noise at a mid-range frequency compared to a traditional filter, the mid-range frequency including a range of frequencies from approximately one-tenth of a bandwidth of the PLL 203 to approximately ten times the bandwidth (10 kilohertz to 1 megahertz in this illustration). The noise due to the bias resistance Rz 240 is limited to lower frequencies, e.g., less than one-tenth of the bandwidth (10 kilohertz in this illustration). As the value of the bias resistance Rz 240 is increased to reduce capacitance and the silicon area (Rz 240 and C/n 210 provide the zero frequency for stability), noise increases at low frequencies while leaving the wider spectrum of higher frequencies, e.g., greater than 10 kilo hertz, less noisy compared to the traditional filter 100.

The noise associated with the filter 200 is primarily due to the feedback resistance Rfb 220 (or the gm 290). This noise may be limited by configuring a small value for the resistance Rfb 220 (or a large value for the gm 290). The phase noise generated by the feedback resistance Rfb 220 (or the gm 290) is present till a higher frequency. The higher frequency includes a range of frequencies from direct current (DC) to approximately ten times the bandwidth of the PLL 203. On the higher end of the frequency spectrum, the noise is present at the same range of frequencies as R 152 described with reference to FIG. 1B, however since Rfb 220 is configurable to have a much smaller value than R 152, total noise is reduced dramatically. As described earlier, the value of Rfb 220 (or gm 290) does not play a role in setting the zero frequency of the filter 200. By configuring the value of the Rfb 220 to be small (or gm 290 to have a large value) the filter 200 advantageously enables a large gain of the charge pump 294. Thus, the total integrated noise of the filter 200 is reduced relative to the traditional filter 100, while achieving a reduction in capacitance size and silicon area by a factor of n.

Referring to FIG. 3A and FIG. 3B, the graphs 310 and 320 illustrate transfer functions for noise from the resistance R 152 having a high value of 40 kilo ohms and a low value of 5 kilo ohms, and from the feedback resistance Rfb 220 having a low value of 4.5 kilo ohms and a bias resistor Rz 240 having a high value of 36 kilo ohms. The graphs 310 and 320 illustrate that the filter 200 advantageously provides performance and silicon area savings corresponding to a large resistance value (e.g., 40 kilo ohms, and a small capacitance value) in the traditional filter 100 but generate noise corresponding to a small resistance value (e.g., 5 kilo ohms) of the resistance R 152. A silicon area to fabricate the capacitor C/n 210 is reduced by the factor of n. A noise generated by the bias resistor Rz 240 having the larger resistance value n*R, e.g., 40 kilo ohms, is substantially the same as a noise generated by the traditional filter 100 having the resistor R 152 equal in value to the feedback resistor Rfb 220, e.g., smaller value of 5 kilo ohms. In an exemplary, non-depicted embodiment, scaling factor of 10, e.g., n=10, may be applied without any noise penalty, e.g., without degrading the noise performance of the filter 200.

The graphs 310 and 320 also illustrate that a noise generated by the bias resistor Rz 240 is limited to a lower frequency range varying from frequencies DC to approximately one-tenth of the bandwidth of the PLL 203 and a noise generated by the feedback resistor Rfb 220 is present till a higher frequency range which is similar as with R 152 included in the filters 160 and 170.

Figure 4A:
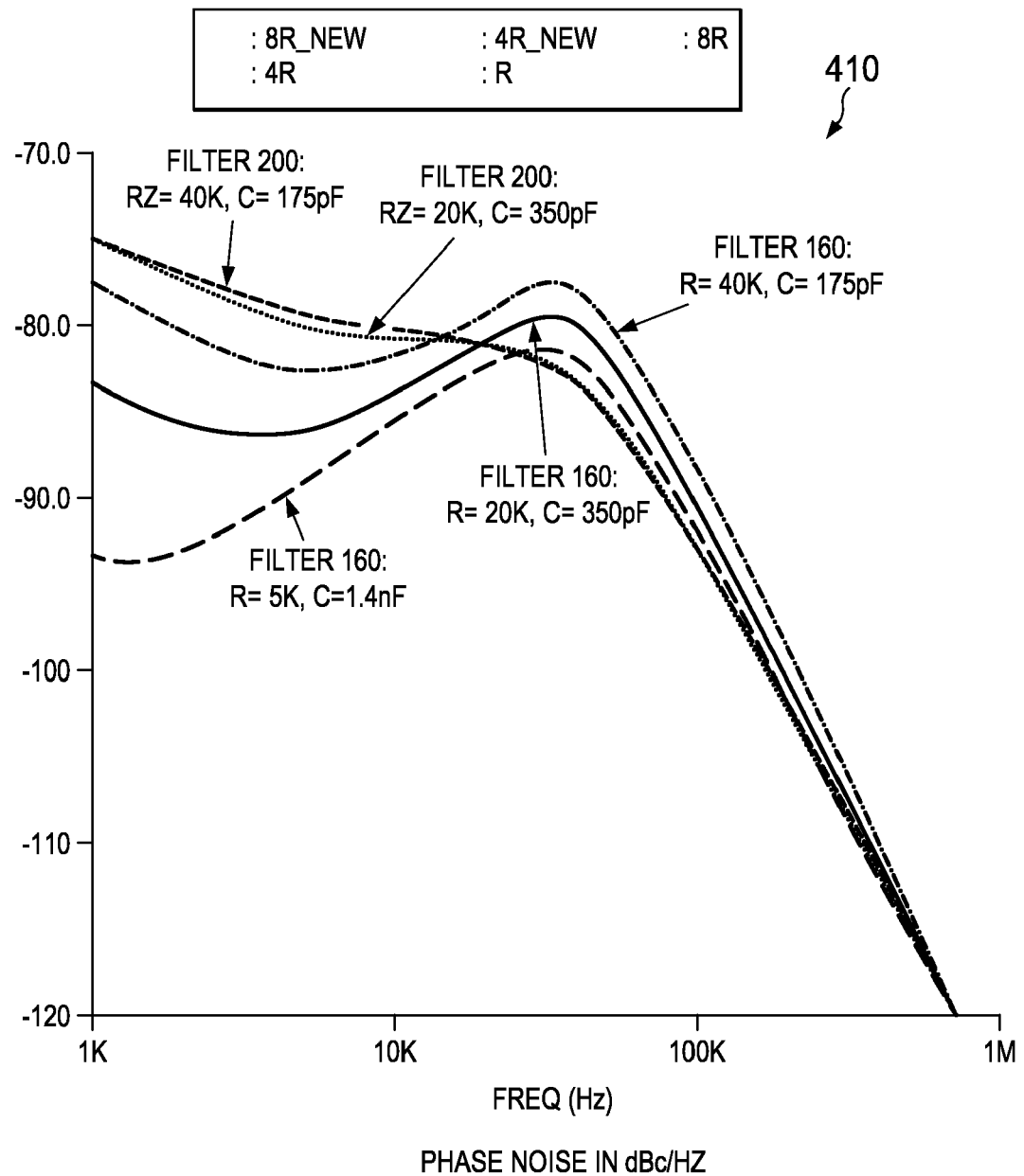
FIG. 4A is a graph illustrating noise response for filters described with reference to FIGS. 1B, 2A, 2B, and 2C, according to an embodiment.
Figure 4B:
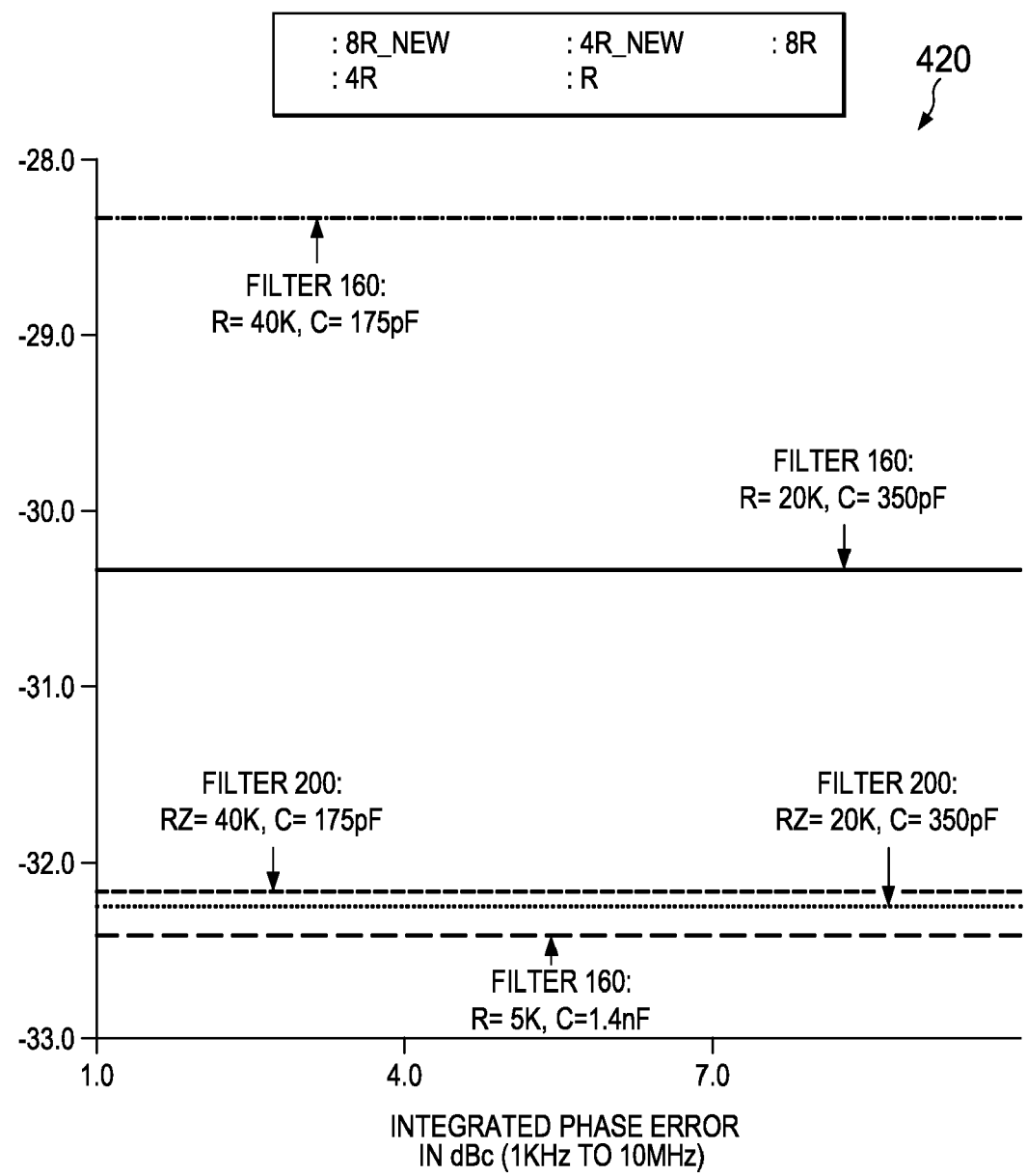
FIG. 4B is a graph illustrating integrated phase error for filters described with reference to FIGS. 1B, 2A, 2B, and 2C, according to an embodiment.
Figure 4C:
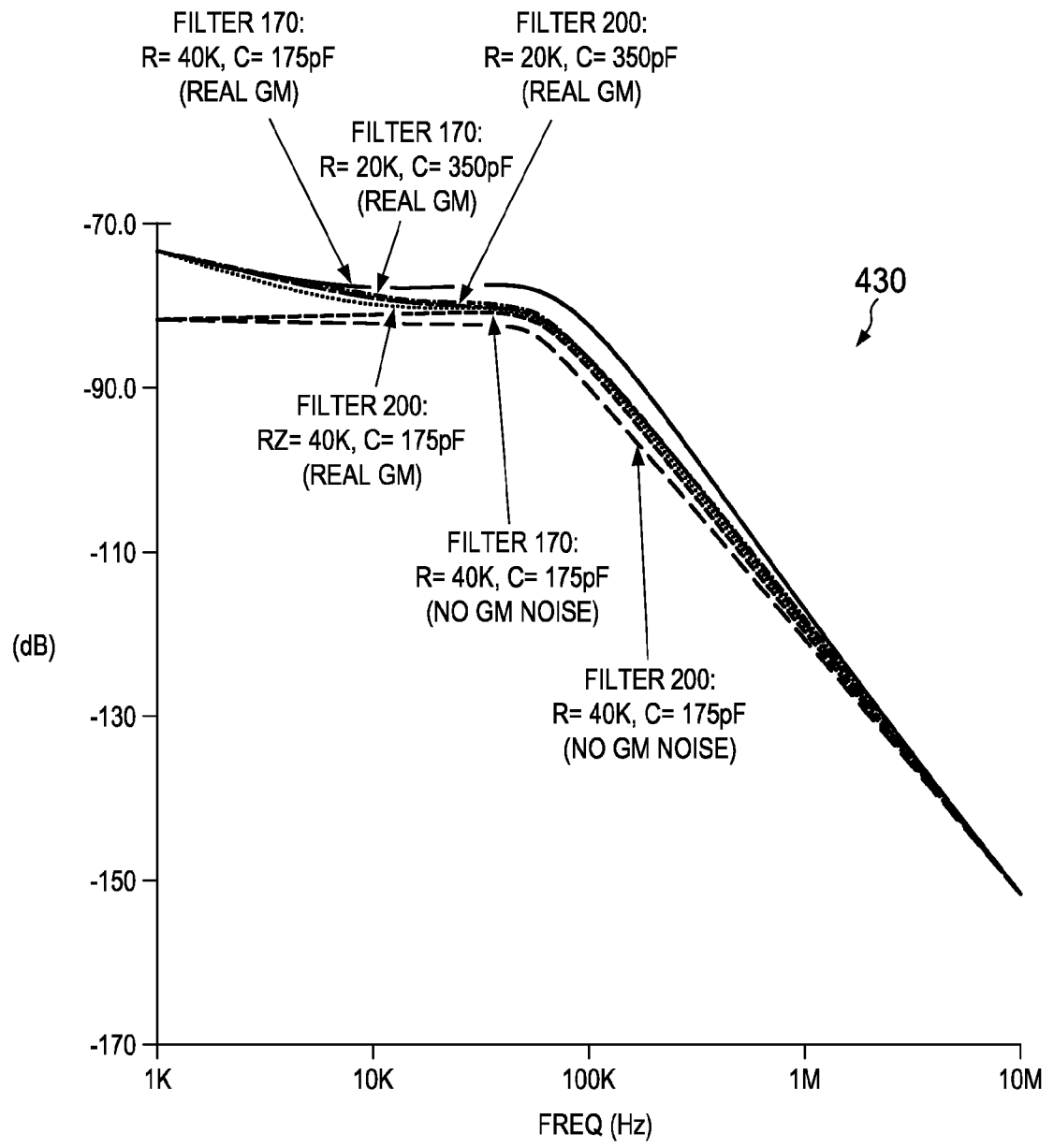
FIG. 4C is a graph illustrating noise response for filters described with reference to FIGS. 1C, 2A, 2B, and 2C, according to an embodiment.
Figure 4D:
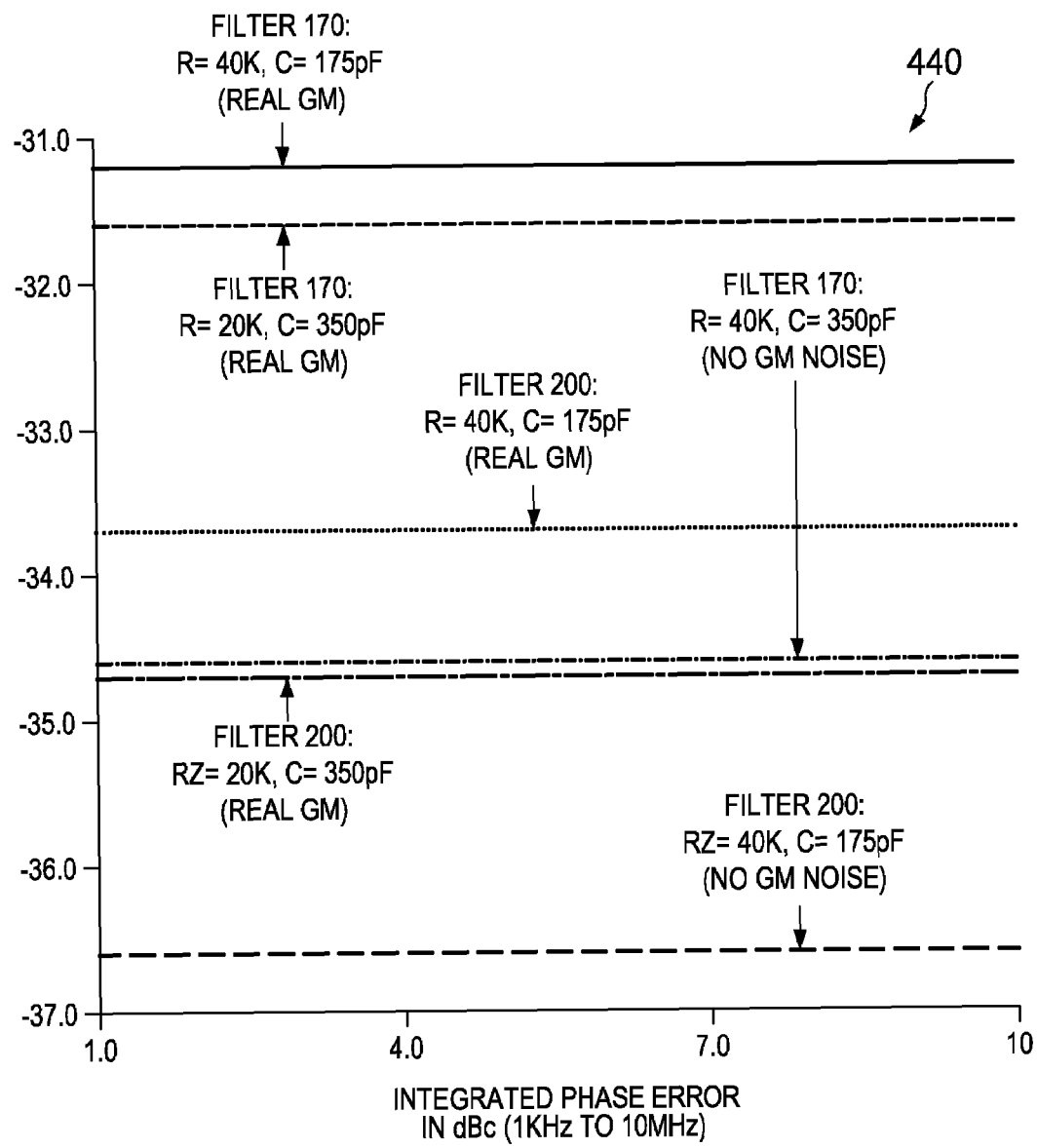
FIG. 4D is a graph illustrating integrated phase error for filters described with reference to FIGS. 1C, 2A, 2B, and 2C, according to an embodiment.

FIG. 4A is a graph 410 illustrating noise response for filters described with reference to FIGS. 1B, 2A, 2B, and 2C, according to an embodiment. FIG. 4B is a graph 420 illustrating integrated phase error for filters described with reference to FIGS. 1B, 2A, 2B, and 2C, according to an embodiment. FIG. 4C is a graph 430 illustrating frequency response for filters described with reference to FIGS. 1C, 2A, 2B, and 2C, according to an embodiment. FIG. 4D is a graph 440 illustrating integrated phase error for filters described with reference to FIGS. 1C, 2A, 2B, and 2C, according to an embodiment.

Referring to FIGS. 4A and 4B, the graphs 410 and 420 illustrate a relationship between phase noise with scaling of the capacitor and resistor, according to an embodiment. In the traditional loop filter 130, the phase noise increases with capacitor scaling (e.g., increasing resistor R 152). In the filter 200, the noise advantageously does not increase in the wider part of the frequency spectrum and hence the integrated noise is kept virtually unchanged. For the filter 200, the increase of noise in the lower frequencies does not contribute much to the integrated phase noise since the close-in noise may be determined by the phase noise of a reference clock of the PLL 203 and noise generated by the charge pump 294. Thus, compared to the traditional loop filter 130, the filter 200 advantageously provides an improvement of noise at the wide frequency spectrum near the loop bandwidth. In the simulation results described with reference to FIGS. 4A and 4B, noise from input reference and charge pump are not included, since the focus was on comparing the filter 200 with the traditional filters. In the presence of input and charge-pump noise the advantages of the filter 200 will be more prominent.

Figure 1C:
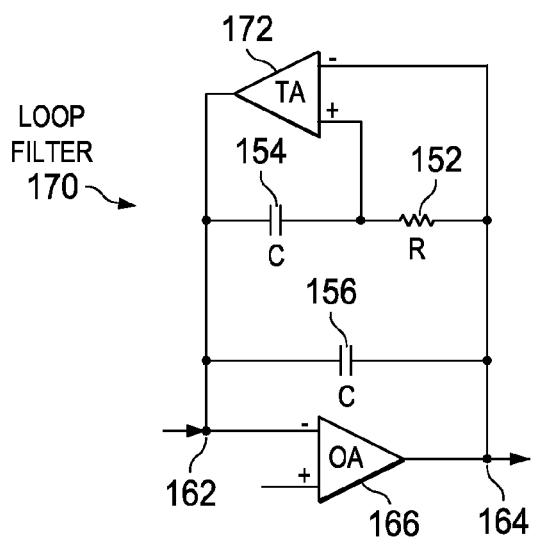
FIG. 1C illustrates a traditional loop filter having multiple active components, described herein above, according to prior art.

Referring to FIGS. 4C and 4D, the graphs 430 and 440 illustrate the noise performance of the filter 200 relative to the prior art loop filter 170 described with reference to FIG. 1C. The noise advantage of the filter 200 versus the filter 170 at higher frequencies and integrated phase error of the filter 200 are shown for different values of the bias resistor Rz 240 and also in the presence and absence of the noise in the active element, e.g., the transconductance gm 290.

Figure 5:
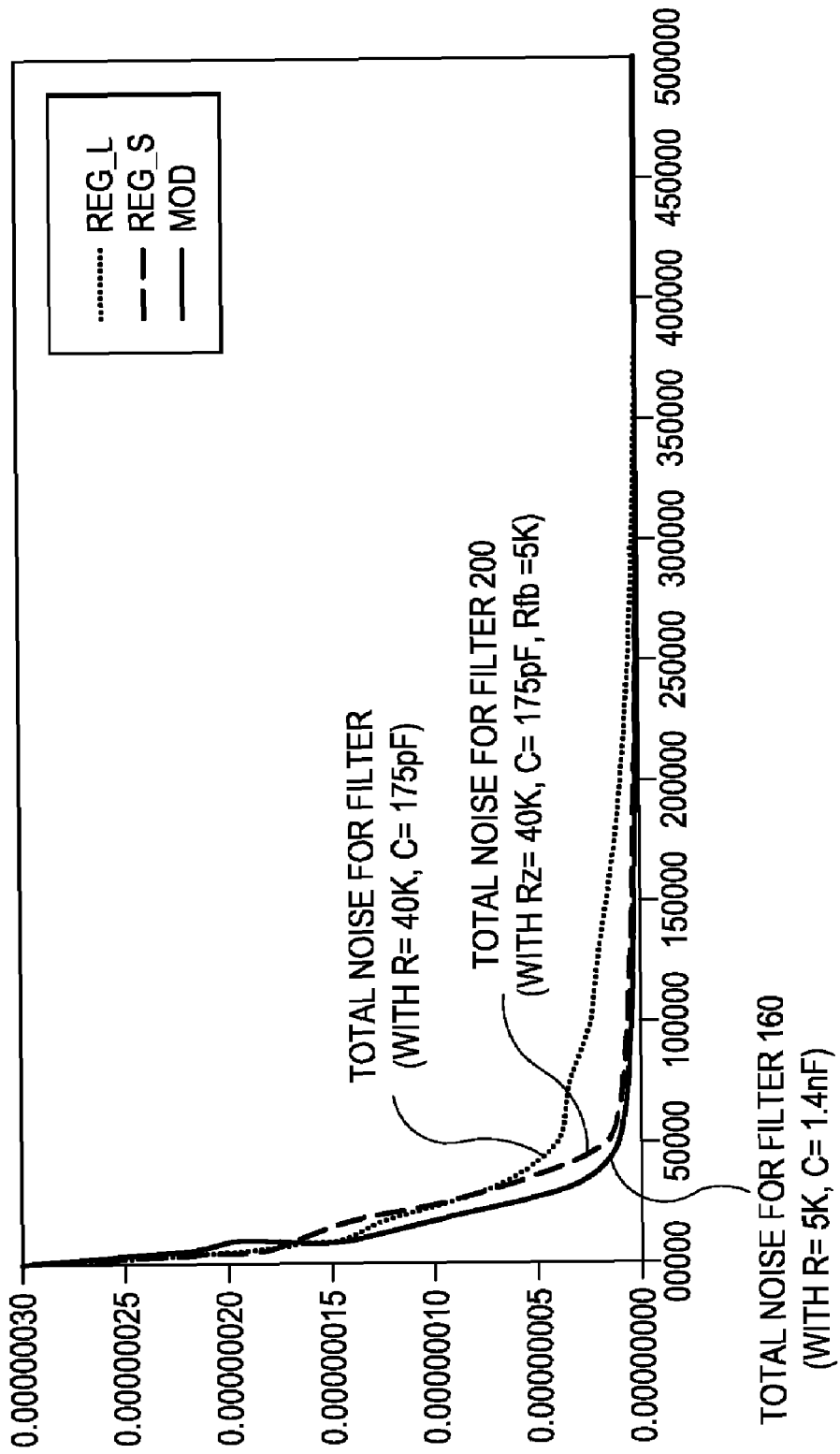
FIG. 5 is a graph illustrating total noise for a PLL described with reference to FIGS. 1A, 1B, and 1C, and a PLL described with reference to FIGS. 2A, 2B, and 2C, according to an embodiment.

FIG. 5 is a graph 510 illustrating total noise for the PLL 100 described with reference to FIGS. 1A, 1B, and 1C, and the PLL 203 described with reference to FIGS. 2A, 2B, and 2C, according to an embodiment. The graph 510, drawn on a linear scale, illustrates the benefit of the filter 200 by providing the performance and area savings associated with a large resistor small capacitor implementation of a traditional loop filter but advantageously eliminating the noise penalty associated with the large resistor small capacitor implementation of the traditional loop filter.

Figure 6A:
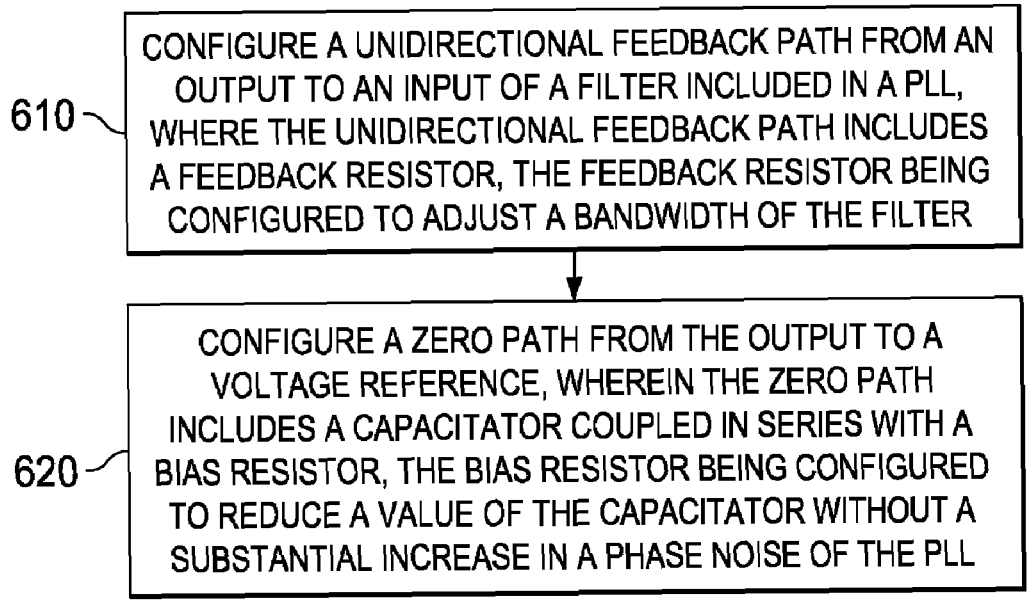
FIG. 6A is a flow chart illustrating a method for filtering an input signal with a filter included in a phase lock loop (PLL), according to an embodiment.

FIG. 6A is a flow chart illustrating a method for filtering an input signal with a filter included in a PLL, according to an embodiment. In a particular embodiment, FIG. 6 illustrates the method for filtering using the filter having an input and an output described with reference to FIGS. 2A, 2B, and 2C. At step 610, a unidirectional feedback path is configured from the output to the input. The unidirectional feedback path includes a feedback resistor that is configured to adjust a bandwidth of the filter. At step 620, a zero path is configured from the output to a voltage reference. The zero path, which determines a zero frequency of the filter, includes a capacitor coupled in series with a bias resistor, the bias resistor being configured to reduce a value of the capacitor without a substantial increase in a phase noise of the PLL.

Figure 6B:
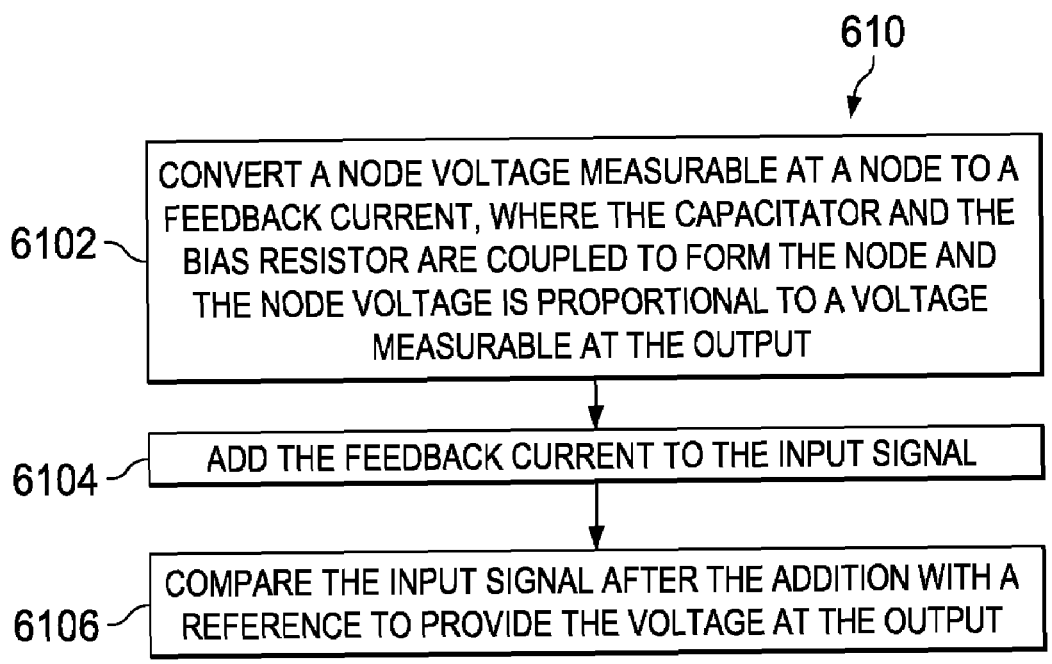
FIG. 6B is a flow chart illustrating a method for configuration of a unidirectional feedback path described with reference to FIG. 6A, according to an embodiment.

Various steps described above may be added, omitted, combined, altered, or performed in different orders. For example, the step 610 may include additional steps 6102, 6104, and 6106. FIG. 6B is a flow chart illustrating a method for configuration of the unidirectional feedback path described with reference to step 610, according to an embodiment. At step 6102, a node voltage measurable at a node is converted to a feedback current, the node being formed by the coupling of the capacitor and the bias resistor. The node voltage is proportional to a voltage measurable at the output. At step 6104, the feedback current is added to the input signal. At step 6106, the input signal after the addition of feedback is converted to a voltage at the output.

Several advantages are achieved by the method and system according to the illustrative embodiments presented herein. The embodiments advantageously provide an improved apparatus and method for filtering an input signal. The improved apparatus and method advantageously provides the benefits of having an active RC circuit with a large resistance and a small capacitance without incurring the noise penalty associated with the large resistance. That is, a noise generated by the bias resistor having the larger resistance value n*R is substantially the same as a noise generated by the traditional filter having the resistor equal in value to the feedback resistor Rfb having the smaller value. The improved filter advantageously disables a feedforward path from the input to the output of the filter to reduce the phase noise. Unlike the traditional filter, different resistances advantageously determine the pole/zero locations and the bandwidth of the PLL, thereby improving independent control over the bandwidth and stability of the improved PLL. Proper DC biasing for the capacitance included in the zero path advantageously enables a wide DC tuning range for the VCO.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of a loop filter used in a PLL, the loop filter may be used for, among other things, frequency synthesis, frequency multiplication, pulse synchronization, tone decoding, AM and FM modulation and demodulation, and phase modulation and demodulation. These type of applications are widely used in communications (wired and wireless), and computers. As another example, while certain aspects of the present disclosure have been described in the context of an analog circuit implementation of a PLL, the methods and circuits described herein are applicable to a digital implementation of the PLL or a hybrid analog/digital implementation of the PLL.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be contrued as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A filter having an input and an output, the filter comprising:
   a capacitor coupled to the output;
   a feedback resistor coupled to the input;
   a bias resistor coupled between a node and an output voltage reference, wherein the node is coupled to the output by the capacitor; and
   a buffer having a buffer input and a buffer output, wherein the buffer input is coupled to the node and the buffer output is coupled to the feedback resistor, wherein the buffer enables a unidirectional feedback path from the output to the input, the unidirectional feedback path including the capacitor and the feedback resistor.

2. The filter of claim 1 further comprising:
   an operational amplifier coupled between the input and the output, wherein the operational amplifier includes a first input coupled to the input and a second input coupled to an input voltage reference, wherein the operational amplifier receives a current input in a pulse form at the first input and provides a voltage output at the output; and
   a filter capacitor coupled between the output and the input, the filter capacitor being operable to reduce a ripple of a voltage signal at the output.

3. The filter of claim 1, wherein the buffer disables a feedforward path from the input to the output.

4. The filter of claim 1, wherein a value of the bias resistor and a value of the feedback resistor are configurable to attenuate phase noise at a mid-range frequency compared to a loop filter, wherein the mid-range frequency includes a range of frequencies from approximately one-tenth of a bandwidth of the filter to approximately ten times the bandwidth of the filter.

5. The apparatus of claim 1, wherein the output voltage reference is configurable to provide a direct current (DC) bias to the capacitor.

6. The filter of claim 5, wherein the bias resistor is configurable to adjust the DC bias.

7. The filter of claim 1, wherein the bias resistor and the capacitor provide a zero frequency.

8. The filter of claim 1, wherein a value of the bias resistor is increased by a factor of n to correspondingly scale down a value of the capacitor by the factor of n.

9. The filter of claim 8, wherein a silicon area to fabricate the capacitor is reduced by the factor of n.

10. The filter of claim 9, wherein the phase noise generated by the bias resistor is limited to a lower frequency, wherein the lower frequency includes a range of frequencies from approximately DC to approximately one-tenth of a bandwidth of the PLL.

11. The filter of claim 1, wherein the feedback resistor is configurable to have a phase noise independent of a value of the capacitance.

12. The filter of claim 1, wherein the buffer is selectable to be one of a voltage buffer having a unity gain and a voltage amplifier having a configurable gain, wherein the buffer provides a voltage at the node to the feedback resistor without drawing a substantial current from the node relative to a current drawn by the bias resistor.

13. The filter of claim 1, wherein the buffer is a transconductance amplifier, wherein the transconductance amplifier provides the buffer output as a current output in response to the buffer input received as a voltage input.

14. The filter of claim 1, wherein the feedback resistor is directly coupled to the input.

15. The filter of claim 1, wherein the buffer input is directly coupled to the node.

16. The filter of claim 1, wherein the buffer output is directly coupled to the feedback resistor.

17. A method for filtering an input signal with a filter included in a phase lock loop (PLL), the filter having an input and an output, the method comprising:
    configuring a unidirectional feedback path from the output to the input, wherein the unidirectional feedback path includes a feedback resistor, the feedback resistor being configured to adjust a bandwidth of the PLL; and
    configuring a zero path from the output to a voltage reference, wherein the zero path includes a capacitor coupled in series with a bias resistor, the bias resistor being configured to reduce a value of the capacitor without a substantial increase in a phase noise of the PLL.

18. The method of claim 17, wherein the zero path excludes the feedback resistor and the input.

19. The method of claim 17, wherein the phase noise of the PLL is substantially the same as a phase noise of a PLL having a filter configured with a resistance having a value equal to that of the feedback resistor and a correspondingly higher value of the capacitor.

20. The method of claim 17, wherein the feedback resistor is configured to cause the phase noise present near and beyond a bandwidth of the PLL to be smaller than a phase noise of a PLL having a loop filter.

21. A method for filtering an input signal with a filter included in a phase lock loop (PLL), the filter having an input and an output, the method comprising:
    configuring a unidirectional feedback path from the output to the input, wherein the unidirectional feedback path includes a feedback resistor, the feedback resistor being configured to adjust a bandwidth of the PLL, further comprising:
        converting a node voltage measurable at a node to a feedback current, wherein the capacitor and the bias resistor are coupled to form the node, wherein the node voltage is proportional to a voltage measurable at the output;
        adding the feedback current to the input signal; and
        summing up the input signal after the addition with a reference to provide the voltage at the output; and
    configuring a zero path from the output to a voltage reference, wherein the zero path includes a capacitor coupled in series with a bias resistor, the bias resistor being configured to reduce a value of the capacitor without a substantial increase in a phase noise of the PLL.

22. The method of claim 21, wherein the converting is performed by one of a voltage buffer and a transconductance amplifier.

23. A phase locked loop (PLL) having a configurable bandwidth, the PLL comprising:
    a filter including:
        a unidirectional feedback path from an output of the filter to the input of the filter, wherein the unidirectional feedback path includes a feedback resistor, the feedback resistor being configured to adjust the bandwidth;
        a zero path from the output to a voltage reference, wherein the zero path includes a capacitor coupled in series with a bias resistor, the bias resistor being configured to reduce a value of the capacitor without substantially increasing a phase noise of the PLL; and
    a voltage controlled oscillator (VCO) having a VCO input and a VCO output, wherein the VCO input is coupled to the output of the filter, wherein a frequency of the VCO output is adjustable by adjusting the output of the filter and by adjusting the voltage reference.

* * * * *